(12) United States Patent
Daskalakis et al.

(10) Patent No.: US 6,551,120 B2
(45) Date of Patent: *Apr. 22, 2003

(54) CARD RETENTION MECHANISM

(75) Inventors: George H. Daskalakis, Forest Grove, OR (US); Daryl J. Nelson, Beaverton, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/389,282

(22) Filed: Sep. 2, 1999

(65) Prior Publication Data

US 2002/0142642 A1 Oct. 3, 2002

(51) Int. Cl.[7] ............................................ H01R 13/62
(52) U.S. Cl. ............................. 439/328; 439/157
(58) Field of Search ......................... 439/325, 327, 439/328, 629–631, 152, 157

(56) References Cited

U.S. PATENT DOCUMENTS

| | | | |
|---|---|---|---|
| 3,853,379 A | * 12/1974 | Goodman et al. | 439/328 |
| 3,944,311 A | * 3/1976 | Sprenkle et al. | 439/157 |
| 4,301,494 A | * 11/1981 | Jordan | 439/157 |
| 4,327,835 A | 5/1982 | Leger | 211/41 |
| 4,349,237 A | * 9/1982 | Cobaugh et al. | 439/328 |
| 4,445,740 A | * 5/1984 | Wallace | 439/157 |
| 4,525,771 A | 6/1985 | Hänseler et al. | 361/413 |
| 4,826,447 A | 5/1989 | Forker et al. | 439/328 |
| 4,938,701 A | * 7/1990 | Heberling | 439/327 |
| 5,218,519 A | 6/1993 | Welch et al. | 361/415 |
| 5,319,524 A | 6/1994 | Welch et al. | 361/754 |
| 5,406,455 A | 4/1995 | Devenish, III | 361/752 |
| 5,477,426 A | 12/1995 | Bethurum | 361/737 |
| 5,515,240 A | 5/1996 | Rodeffer et al. | 361/759 |
| 5,533,631 A | 7/1996 | Marchetti | 211/41 |
| 5,563,770 A | 10/1996 | Bethurum | 361/737 |
| 5,563,771 A | 10/1996 | Bethurum | 361/737 |
| 5,580,203 A | 12/1996 | Read et al. | 411/508 |
| 5,593,036 A | 1/1997 | Dyble et al. | 206/464 |
| 5,603,628 A | 2/1997 | Schapiro, Jr. | 439/327 |
| 5,637,004 A | * 6/1997 | Chen et al. | 439/328 |
| 5,650,917 A | 7/1997 | Hsu | 361/759 |
| 5,676,561 A | * 10/1997 | Chiang | 439/328 |
| 5,766,031 A | * 6/1998 | Yeh | 439/328 |
| 5,906,501 A | * 5/1999 | Longueville et al. | 439/327 |
| 5,980,273 A | * 11/1999 | Yong et al. | 439/328 |
| 5,980,282 A | * 11/1999 | Cheng | 439/157 |
| 6,030,239 A | * 2/2000 | Liu | 439/160 |
| 6,045,386 A | * 4/2000 | Boe | 439/327 |
| 6,074,232 A | * 6/2000 | Choy et al. | 439/328 |
| 6,083,026 A | * 7/2000 | Trout et al. | 439/328 |

OTHER PUBLICATIONS

Accelerated Graphics Port (AGP) Interface Specification, Intel Corporation, Revision 2.0, (May 4, 1998).

AGP Pro Specification, Intel Corporation, Revision 0..9, (Jul. 1998).

* cited by examiner

Primary Examiner—Hien Vu
(74) Attorney, Agent, or Firm—Kenyon & Kenyon (57) ABSTRACT

A retention mechanism for securing an electrical connector of a printed circuit card to an electrical connector of a main circuit board is presented. The retention mechanism has a base, through which each of the connectors fit, having a number of snaplets and a number of guiding ledges. The snaplets secure the retention mechanism to the electrical connector of the main circuit board, while the guiding ledges support the positioning of the electrical connector of the printed circuit card in the electrical connector of the main circuit board. A locking feature secures the electrical connector of the printed circuit card in place by fitting into a slot between a card arm and the main body of the printed circuit card. A handle extends from the locking feature, allowing for easy manipulation, so that the locking feature may be locked and unlocked and the printed circuit card may be inserted or removed at will.

8 Claims, 9 Drawing Sheets

CARD RETENTION MECHANISM

FIELD OF THE INVENTION

The present invention relates to a circuit card retention mechanism, and more particularly, to a retention mechanism that secures an electrical connector on a printed circuit card to an electrical connector mounted on a main circuit board.

BACKGROUND OF THE INVENTION

Today, printed circuit cards are used in many electronic devices, such as computers and telecommunications equipment. In these devices, printed circuit cards are often electrically connected to a main circuit board using connectors extending from the printed circuit card and mating with connectors located on the main circuit board.

In conventional personal computers (PC's), for example, the main circuit board is generally referred to as the motherboard. The electrical connector located on the motherboard in a PC is generally referred to as a card slot and can receive a variety of printed circuit cards that support, among other things, video displays, serial interface ports, parallel interface ports, computer memory (RAM) and additional data storage. Many of the printed circuit cards provide inputs and outputs disposed generally on one or more sides of the printed circuit card for connection to external equipment as well as other components internal to the electronic device. Indicator lamps and displays are often disposed on an external face of the printed circuit card to indicate equipment status.

In PC equipment, the printed circuit card electrically mates with the main circuit board when it is installed in a card slot with the printed circuit card connector mated to the main circuit board connector. Printed circuit cards are usually held in place with a fastener, such as a screw, installed at one end of the card. Even with this fastener, printed circuit cards are sensitive to motion and a small degree of motion can dislodge a card and result in an equipment malfunction.

Although a manufacturer tests the equipment prior to shipping, cards may partially dislodge during shipping and handling and result in a subsequent malfunction. The loss of electrical contact that results from partially dislodged cards is often difficult to diagnose because only some of the electrical contacts between the printed circuit card and the main circuit board are lost. Thus, connection between the circuit card and the main circuit board is not completely lost but only impaired, which can be difficult to diagnose. This often leads to calls from dissatisfied customers requesting manufacturer assistance in debugging equipment failures. This extended involvement with the customer increases manufacturer costs and decreases customer confidence in the underlying equipment.

Several patents have issued in an attempt to cope with some of these problems. For example, U.S. Pat. No. 5,603,628, issued to Schapiro, Jr. on Feb. 18, 1997, relates to a retainer for printed circuit cards that combines a set of anchors located on both sides of a connector and an adjustable tie-means, (i.e., tie-wrap), that extends around both sides of the card and engages the connector to secure the card to the connector. The adjustable tie-means allows the retainer to be used with cards of different height. However, because the tie-means extends over both sides of the printed circuit card, it invariably rests on the various printed circuit card components that are necessary for the proper functioning of the card. As a result, repeated connection and disconnection of the tie means may damage the card.

Another example, U.S. Pat. No. 5,650,917, issued to Hsu on Jul. 22, 1997, relates to a Central Processing Unit (CPU) mounting structure that includes a U-shaped mounting frame mounted on an electrical connector that receives a CPU card. The CPU card is held in the U-shaped mounting frame by two holding down devices, i.e., screws. The mounting structure, which is intended for use with CPUs, makes unusable a sizeable amount of space on the circuit board as the U-shaped structure extends on three sides of the board. The U-shaped structure also does not allow interface access to the printed circuit card on the sides.

Yet another example, U.S. Pat. No. 4,826,447, issued to Forker et al. on May 2, 1989, relates to a retainer for locking a printed circuit board with an edge connector that is directly soldered to the conductive paths on a second circuit board. The circuit board is permanently connected to the connector and is removable only after disengaging the retainer and de-soldering the electrical connections to the second circuit board. The retainer, which does not allow interface access to the printed circuit card on the sides, requires a large surface area of potentially usable circuit board space.

Thus, there is a need for a sturdy and reliable printed circuit card retention mechanism that is easy to engage and disengage and does not require de-soldering of connections. There is a further need for a printed circuit card retention mechanism that does not damage the printed circuit card when the retention mechanism is engaged and disengaged. There is yet a further need for a printed circuit card retention mechanism that occupies a minimum of the usable surface area on the printed circuit card and allows for access to connectors on all four sides of the printed circuit card.

SUMMARY OF THE INVENTION

Accordingly, the present invention is directed to a retention mechanism for securing an electrical connector on a printed circuit card to an electrical connector mounted on a main circuit board. The retention mechanism is constructed having a base with at least one snaplet, to secure the retention mechanism to the electrical connector of the main circuit board, and at least one guiding ledge, to support the connection point between the main body of the printed circuit card and the electrical connector of the printed circuit card. The retention mechanism is also constructed having a locking feature, which secures the printed circuit card to the electrical connector of the main circuit board, by fitting into a slot between a card arm and a main portion of the printed circuit board.

The present invention and its features and advantages will become more apparent from the following detailed description with reference to the accompanying drawings.

DETAILED DESCRIPTION

FIGS. 1 to 10 illustrate a printed circuit card retention mechanism that secures an electrical connector of a printed circuit card to an electrical connector on a main circuit board. The Figures show a printed circuit card with an edge card type electrical connector and a main circuit board with a receptacle type electrical connector, according to an embodiment of the present invention. The retention mechanism may be constructed of plastic or any other nonconductive fire-resistant material.

Figure 1:
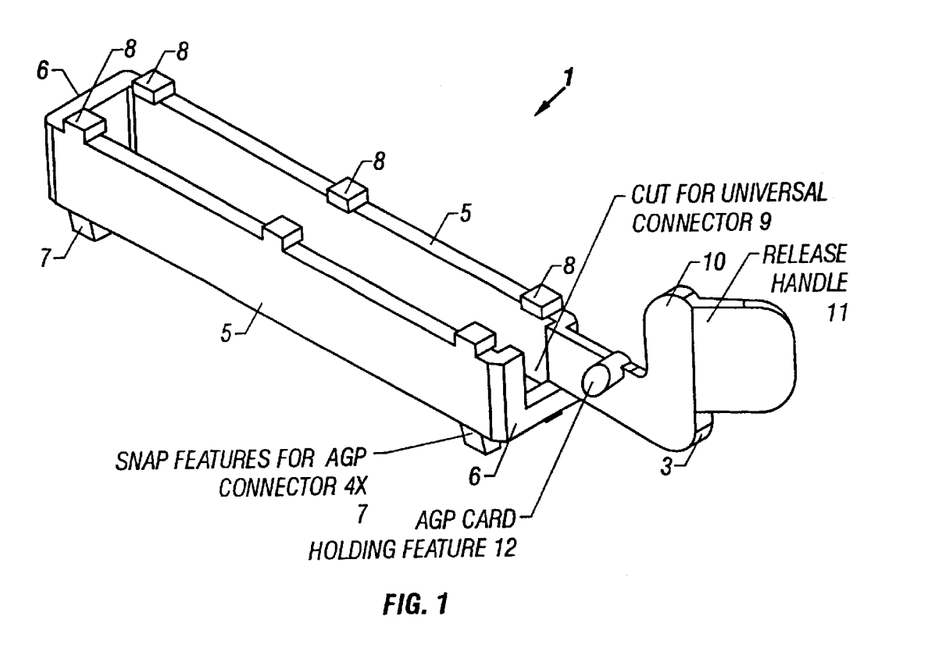
FIG. 1 illustrates a side view of a Retention Mechanism with locking finger feature, according to an embodiment of the present invention.

Referring to FIG. 1, a retention mechanism with a locking finger feature is illustrated. The retention mechanism is constructed having a base 1 forming a slot through which the electrical connectors of the printed circuit card and main circuit board fit. The base 1 thus, is rectangular in shape, having two long crosspieces 5 and two short crosspieces 6. To form the rectangular shape of the slot, each of the two long crosspieces 5 and the two short crosspieces 6 run parallel to one another, with the two short crosspieces 6 abutting the ends of the long crosspieces 5.

Integrally connected to the base 1, at a lower portion thereof, are a number of snaplets 7. Each snaplet 7 has a small finger which extends inwardly from a lower portion thereof In this manner then, the snaplets 7 are able to snap onto the main circuit board connector (not shown) and thus securely fasten the base 1 of the retention mechanism to the main circuit board connector. Also integrally connected to the base 1, at an upper portion thereof, are a number of guiding ledges 8. The guiding ledges 8 protrude slightly inward of each of the long crosspieces 5 and serve as guides for a printed circuit card connector (not shown). When the retention mechanism is snapped onto the main circuit board connector by means of the snaplets 7, the printed circuit card connector can be inserted through base 1 of the retention mechanism, guided by the guiding ledges 8, to snugly fit into the main circuit board connector. The guiding ledges 8 also act to prevent the printed circuit card from being able to be moved back and forth, from movement of the computer chassis, thereby acting to prevent breakage at the point where the edge card connector is connected to the main body of the printed circuit card.

Further, at one end of the base 1, a valley cut 9 is cut into crosspiece 6. On one side of the valley cut 9, a locking finger feature 3, according to one embodiment of the present invention, is integrally connected to the base 1. A handle 10, of the locking finger feature 3, extends outwards and then upwards from the base 1, and allows for physical manipulation of the locking finger feature 3. A release tab 11 may be integrally attached to handle 10, on the portion extending upwardly from the base 1, for even easier grasping and physical manipulation of the locking feature 3. Also integrally attached to the handle 10, but on the portion extending outwardly from the base 1, is a locking finger 12. The end of the locking finger 12 is diagonally angled slightly so that when an edge of an arm portion of the printed circuit card (not shown) is placed into the slot of the base 1 and comes into contact with the end of the locking finger 12, the pressure on the locking finger 12 causes the handle 10 to bend outward away from the printed circuit card. It is to be understood, of course, that the locking finger feature 3 may be integrally attached at either side of the valley cut 9, and is not to be limited to the side shown in the illustration. In such a case, the locking feature is, of course, constructed as a mirror image of the one shown. Further, it is to be noted that the valley cut acts as a guidance slot to ensure proper insertion for the arm portion of the printed circuit card (not shown), and which will be explained in further detail below.

Figure 2:
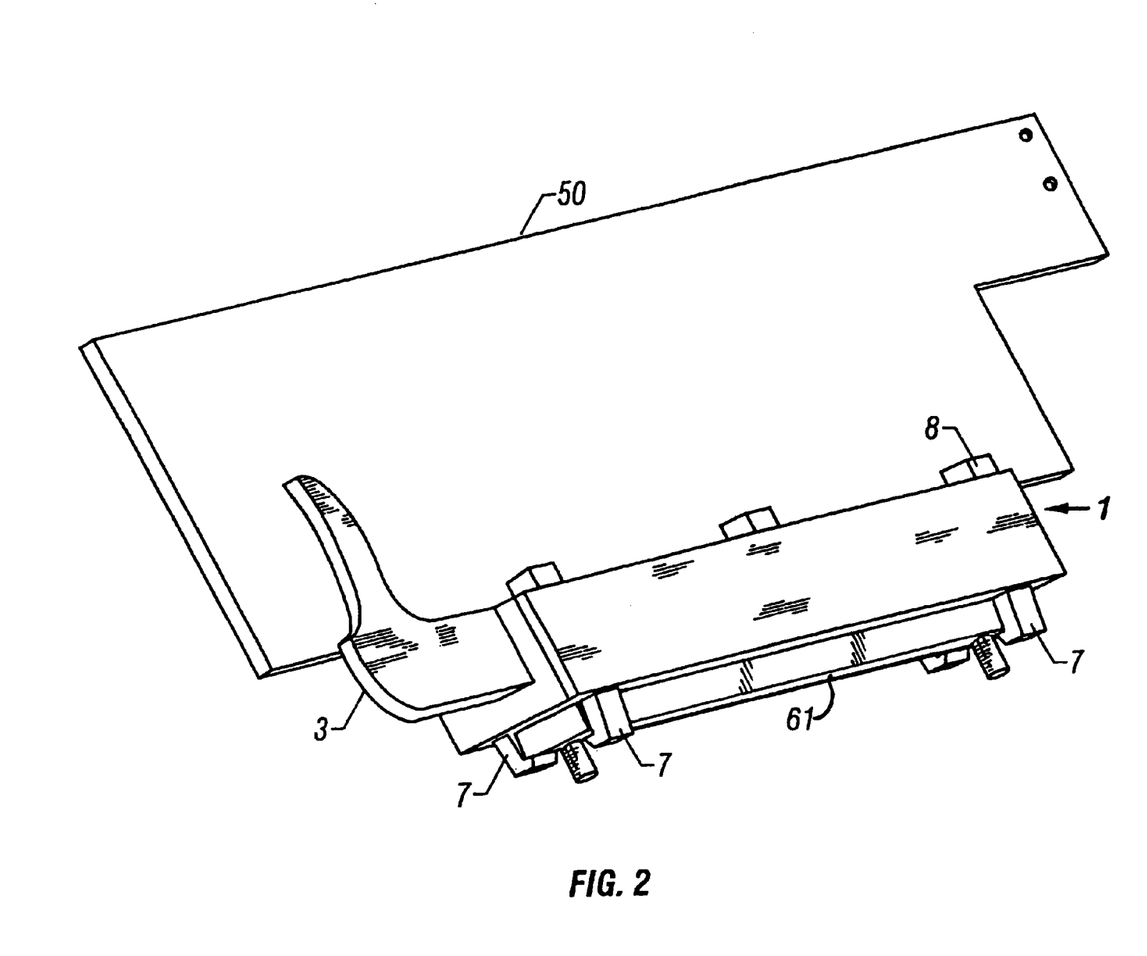
FIG. 2 illustrates a side view of a Retention Mechanism, with locking finger feature, installed on and secured to an electrical connector with a circuit card inserted, according to an embodiment of the present invention.

Referring now to FIG. 2, an illustration of an electrical connector of a printed circuit card 50 (e.g., an accelerated graphics port (AGP) card; AGP specification, version 2.0, 1998) inserted through the base 1 and into a circuit board connector 61 is shown. As can be seen in the Figure, the snaplets 7 have snapped onto the circuit board connector 61, thus firmly engaging the base 1 to the circuit board connector 61. It is to be understood, of course, that the circuit board connector 61 is integrally attached to the main circuit board (not shown). As can also be seen, the guiding ledges 8 are supporting the printed circuit card 50 so as to prevent bending, and possible breakage, of the point where the electrical connector of the printed circuit card 50 and the main body of the printed circuit card 50 are joined. The locking finger feature 3 is shown to one side of the printed circuit card 50.

Figure 3:
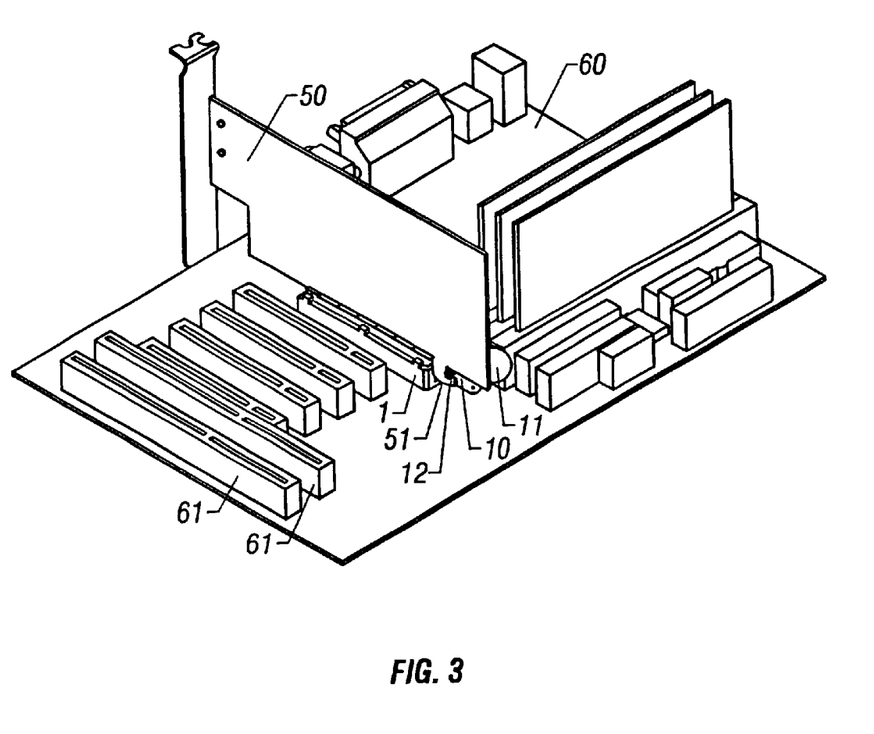
FIG. 3 illustrates an isometric view of the Retention Mechanism, with locking finger feature, securing a circuit card to a mother board, according to an embodiment of the present invention.
Figure 4:
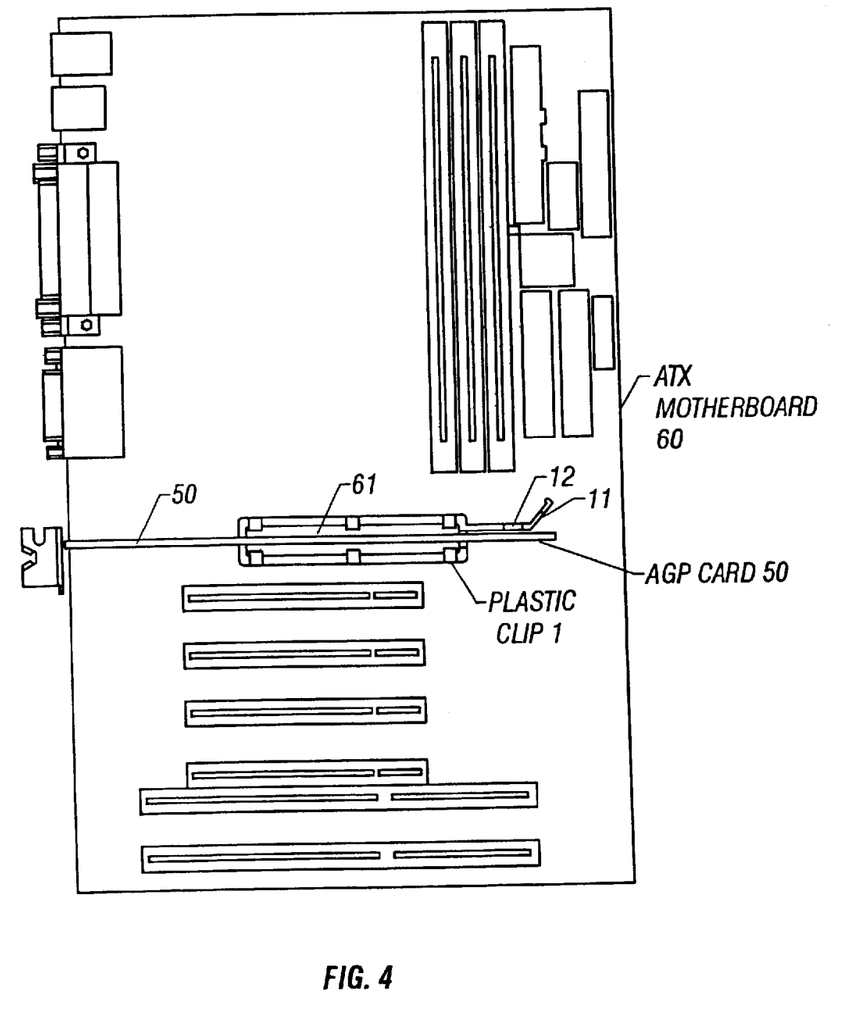
FIG. 4 illustrates a top view of the Retention Mechanism, with locking finger feature, securing a circuit card to a mother board, according to an embodiment of the present invention.

Referring now to FIGS. 3 and 4, an illustration of the retention mechanism with the locking finger feature is shown securing a printed circuit card 50 to a main circuit board 60. As can be seen, the locking finger 12 fits into a slot created between the main body of the printed circuit card 50 and a card arm 51 extending therefrom. As stated above, upon insertion of the printed circuit card connector through the slot of the retention mechanism and into the circuit board connector of the main circuit board, an edge of the card arm 51 comes into contact with the angled edge of the locking finger 12 causing the locking finger feature 3 to bend outward away from the printed circuit card 50. As the electrical connector of the printed circuit card 50 is fully seated in the circuit board connector 61, the locking finger 12 snaps into the slot between the card arm 51 and the main body of the printed circuit card 50. In such a manner then, the locking finger 12 acts to secure the printed circuit card 50 in place. In conjunction, the snaplets 7 act to hold the base 1 of the retention mechanism securely to the circuit board connector 61. As the circuit board 60 can have a number of circuit board connectors 61, it is to be understood, of course, that the retention mechanism of the present invention can be constructed to fit any size of electrical connector 61 for proper securing of an electrical connector of a printed circuit card.

The printed circuit card 50 is removed from the circuit board 60 and the circuit board connector 61 by grasping either the handle 10 or the release tab 11 and pushing outward away from the printed circuit card 50. This has the effect of moving the locking finger 12 out and away from the slot between the card arm 51 and the printed circuit card 50. Upon removing the locking finger 12 by placing pressure on the handle 10 or release tab 11, the circuit card 50 may be removed by simply pulling it up and outward from the circuit board connector 61.

Figure 5:
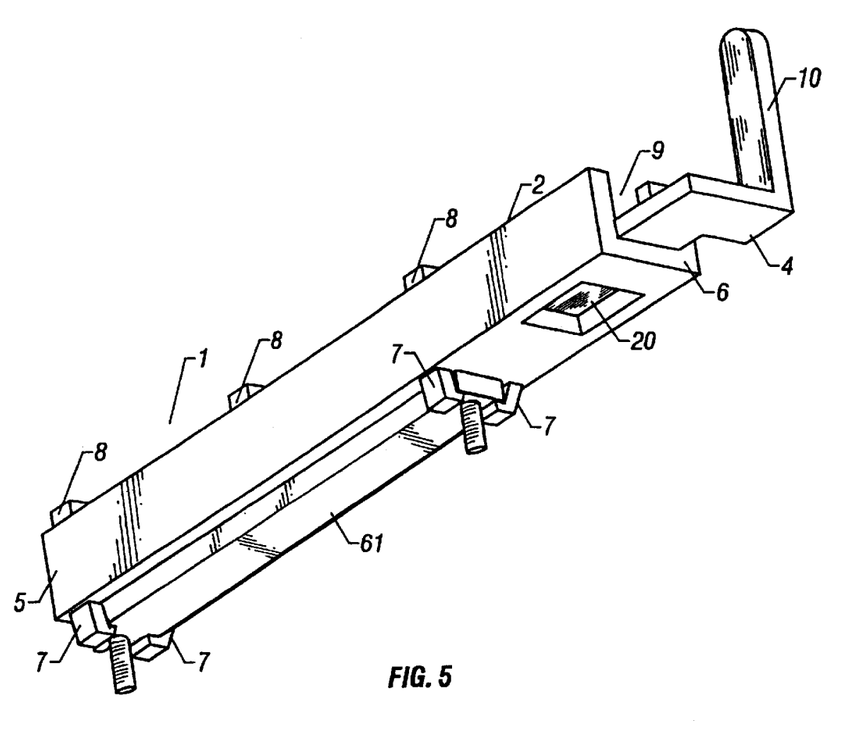
FIG. 5 illustrates a side view of the Retention Mechanism, with locking tab feature, installed on and secured to an electrical connector, according to an alternative embodiment of the present invention.

Referring now to FIG. 5, an alternative embodiment of the retention mechanism is illustrated with a locking tab feature 4. In this embodiment, base 1 of the retention mechanism is extended by means of an integrally connected base extension 2. Such extension of the base 1 is accomplished by simply extending the two long crosspieces 5 further in parallel. Thus, as above, short crosspiece 6 still faces the other short crosspiece 6 at the two ends of base 1, and the retention mechanism still retains its rectangular shape. The snaplets 7 and the guiding ledges 8 can also be retained in their original positions and still act to secure the retention mechanism to the circuit board connector 61 and to support the printed circuit card (not shown), respectively. Also as above, the valley cut 9 still creates a cut in short crosspiece 6 at one end of base 1 (i.e., the end which will contain the locking tab feature 4). In this embodiment, however, handle 10 is not integrally attached to base 1 at short crosspiece 6. Rather, locking tab feature 4 is a separate movable piece which fits into and between valley cut 9 and sits in a hollow 20 of base 1 created by the addition of base extension 2.

Figure 6:
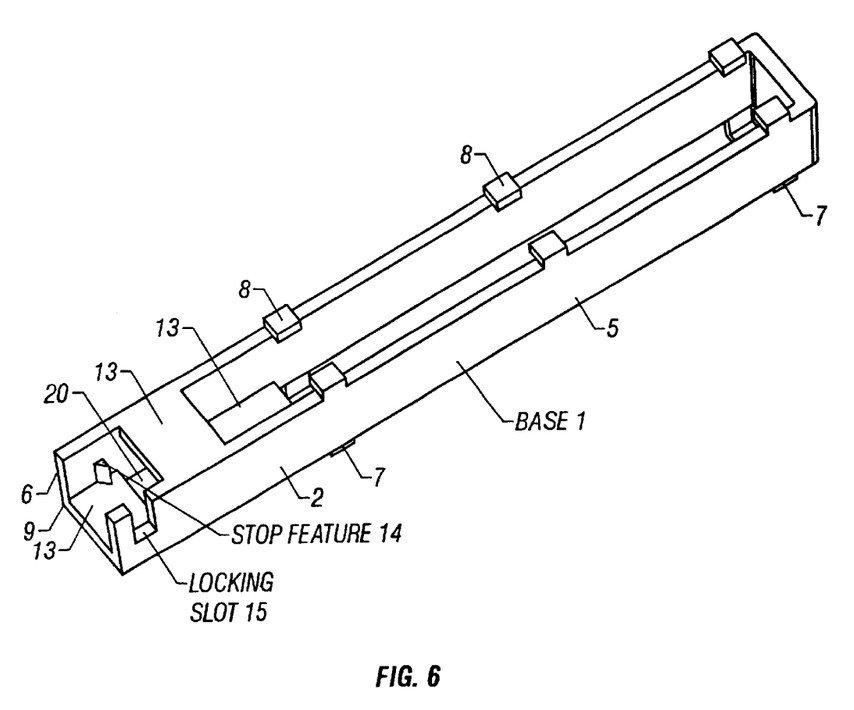
FIG. 6 illustrates a side view of a Retention Mechanism, according to an alternative embodiment of the present invention.

Referring to FIG. 6, the base 1, the base extension 2 and the hollow 20 are more clearly illustrated. As can be seen, the hollow 20 extends from the beginning to the end of base extension 2. A series of bridges 13 run between the base extension 2 at both the upper and lower portions thereof, surrounding the hollow 20 and in effect creating a cage for the locking tab feature 4. Between the positioning of the upper bridge 13 and the end of the base extension 2, a stopper 14 protrudes slightly from one side of the base extension 2, while a locking slot 15 is cut into the other side of the base extension 2.

Figure 7:
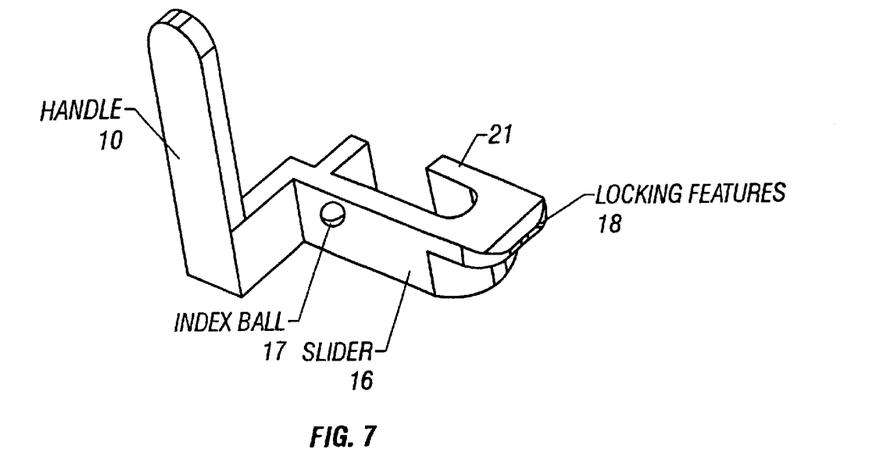
FIG. 7 illustrates a side view of the locking tab feature, according to an embodiment of the present invention.

Referring to FIG. 7, the independently movable locking tab feature 4 is more clearly illustrated. The handle 10 is integrally connected to a slider 16. The slider 16 has extending from it on one side an index ball 17. Index ball 17 is constructed for engagement with locking slot 15 (not shown), as will be explained in detail below, and helps as a visual reference for a determination of whether locking tab feature 4 is fully engaged in a locking position or not. At one end of the slider 16, opposite from the handle 10, a locking feature 18 is positioned. The end of locking feature 18 may be diagonally slanted, as shown, to aid in engagement with the slot between the card arm and printed circuit card (not shown) during locking, as will be explained in more detail below. Further, a portion of slider 16 may be curved to an end 21 for engagement with the stopper 14 (not shown), as will also be explained in more detail below.

Figure 8A:
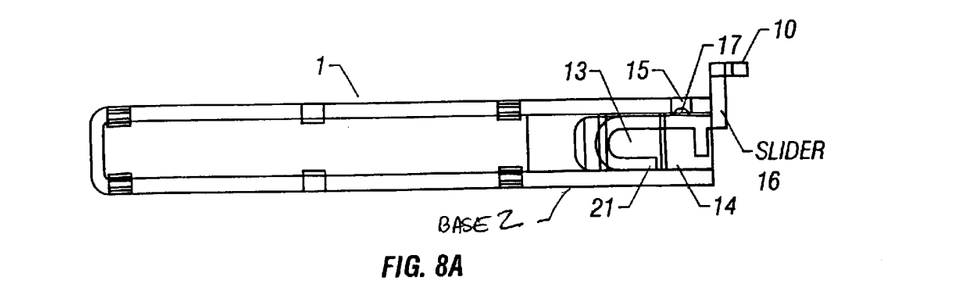
FIGS. 8A and 8B illustrate top views of the locked and unlocked positions of the locking tab feature, according to an embodiment of the present invention.
Figure 8B:
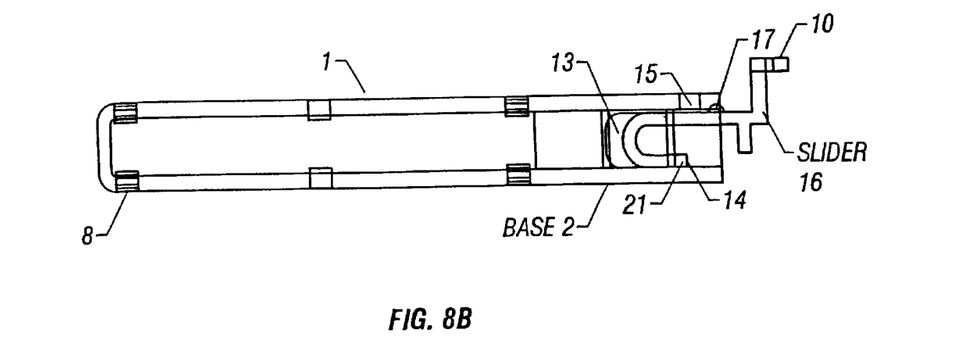

Referring to FIGS. 8A and 8B, the locked and unlocked positions of the locking tab feature 4, positioned in the hollow 20 of base 1, are illustrated, respectively. As can be seen, in FIG. 8A, when the locking tab feature 4 is in a locked position, the index ball 17 snugly fits into the locking slot 15. In FIG. 8B, however, when the locking tab feature 4 is in an unlocked position, the index ball 17 is dislodged from the locking slot 15. Further, in the unlocked position, the curved end 21 of slider 16 abuts the stopper 14. Movement of the locking tab feature 4 between the locked and unlocked positions is accomplished by physical manipulation. The handle 10 is grasped and the locking tab feature 4 is either pushed into or pulled out of the hollow 20 in a direction parallel to the long crosspieces 5 of base 1. While the locking tab feature 4 is positioned such that it can slide back and forth between the locked and unlocked positions, it cannot be removed from the hollow 20 of base extension 2 of base 1 because of the positioning of the upper and lower bridges 13. It is to be noted, of course, that the two bridges 13 connected as illustrated between the lower portions thereof of the two crosspieces 5 may instead be one continuous bridge from the beginning to the end of base extension 2. This is not, however, possible with the bridge 13 connecting the upper portions thereof of the two crosspieces 5, as the card arm 51 must still be inserted into the valley cut 9 and hollow 20, as will be explained in further detail below.

Figure 9:
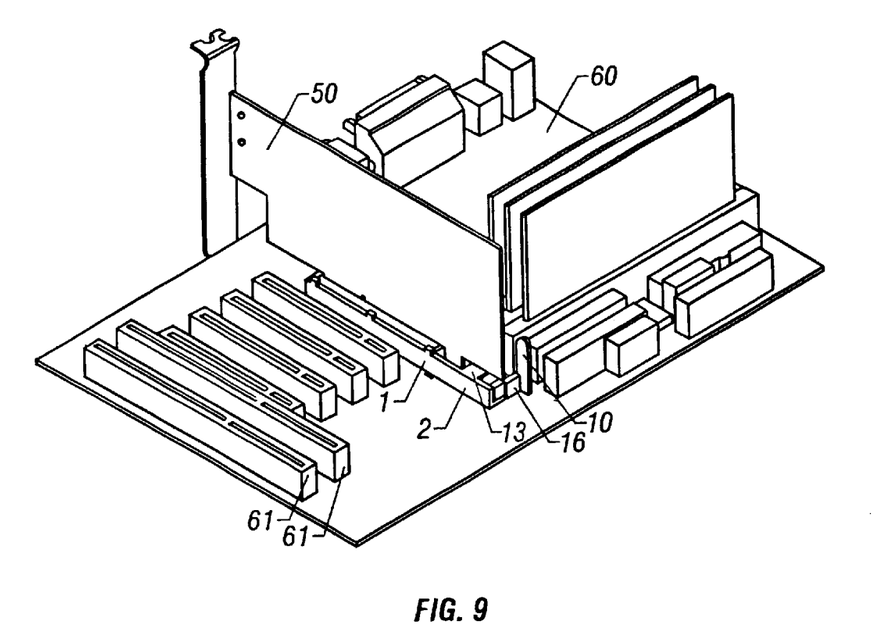
FIG. 9 illustrates an isometric view of the Retention Mechanism, with locking tab feature, securing a circuit card to a mother board, according to an embodiment of the present invention.
Figure 10:
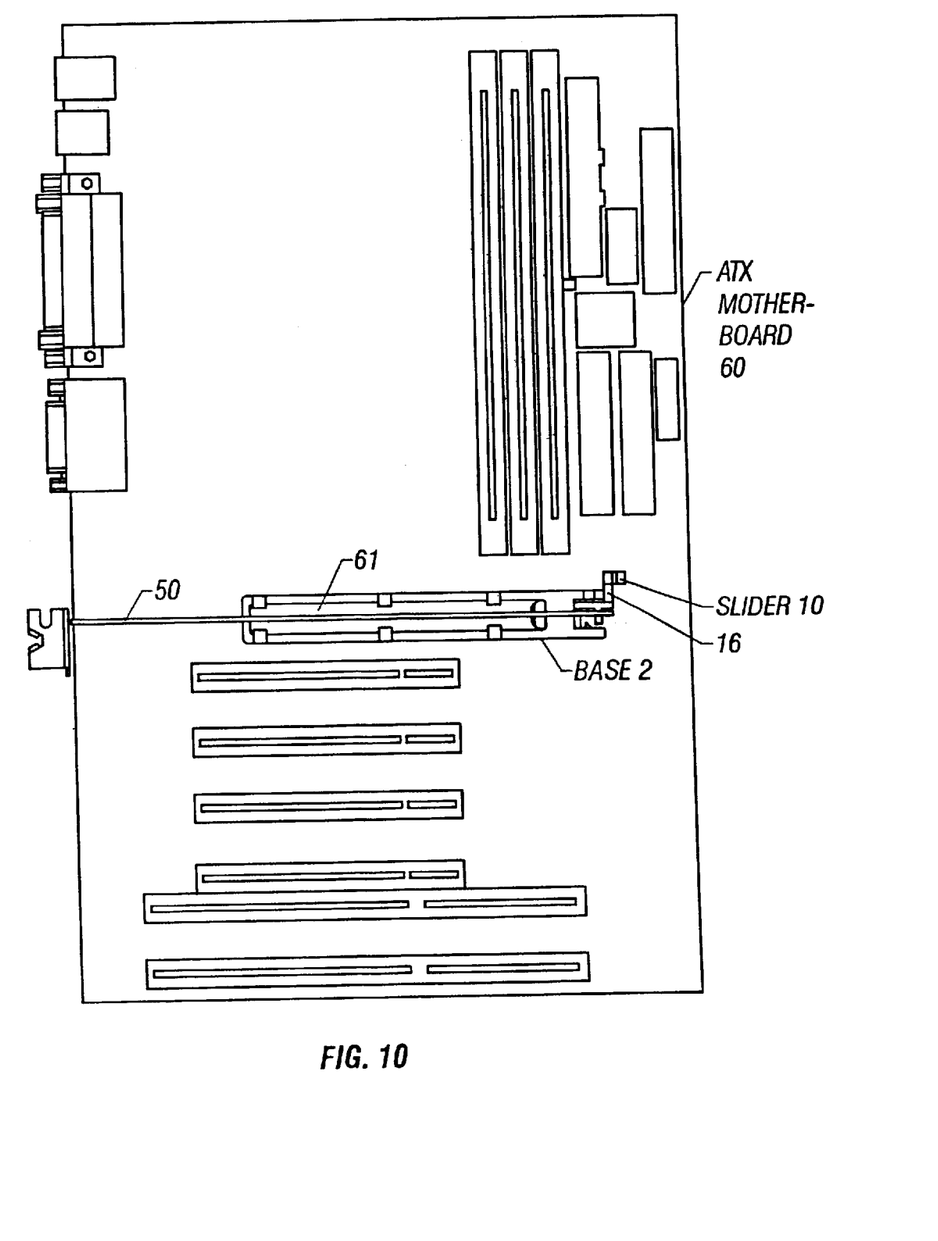
FIG. 10 illustrates a top view of the Retention Mechanism, with locking tab feature, securing a circuit card to a mother board, according to an embodiment of the present invention.

Referring to FIGS. 9 and 10, the retention mechanism with a locking tab feature 4 is illustrated securing a printed circuit card 50 to a circuit board connector 61. The printed circuit card 50 is secured to the circuit board connector 61 by the retention mechanism when the locking tab feature 4 is in the locked position, as shown in the Figures. In the locked position, the locking feature 18 has been slid into the slot between the card arm 51 and the printed circuit card 50, and the index ball 17 is fitted into the locking slot 15. In such a manner then, the printed circuit card 50 cannot be removed as the locking feature 18, in the locked position inserted into the slot between the card arm 51 and the printed circuit card 50, prevents it from being so. To remove the printed circuit card 50 from its connection with the circuit board connector 61, the handle 10 is grasped with one hand and slid outward from the base 1 and the base extension 2 to its unlocked position as in FIG. 8B. At this point, the locking feature 18 no longer resides in the slot between the main portion of the printed circuit card 50 and the card arm 51, and the index ball 17 no longer sits in the locking slot 15. At this point, the printed circuit card 50 may be removed from the circuit board connector 61 simply by lifting it out of the connector 61.

Thus as can be seen, the retention mechanism of the present invention, as shown in the two embodiments, secures a printed circuit card to an electrical connector of a circuit board, preventing uncoupling of the electrical leads of the connectors and ensuring proper operation. In addition, while the application of the present invention to computer equipment, such as PC's and computer servers, is unmistakable, the present invention may apply to any type of electronic equipment where two discrete printed circuit cards are electrically connected. This includes, but is not limited to, telecommunications equipment such as line interface cards, transceivers, power modules, and switch modules.

It is to be understood and expected that additional variations in the principles of construction herein disclosed may be made by one skilled in the art and it is intended that such modifications, changes, and substitutions are to be included within the scope of the present invention.

What is claimed is:

1. An apparatus for securing two electrical connectors together, the apparatus comprising:
   a base, which essentially surrounds an electrical connected portion of an essentially upright printed circuit card and a circuit board connector when connected;
   a snaplet arrangement, integrally attached to the base, which secures the base to the circuit board connector; and
   at least one guiding ledge which supports connection of an electrical edge portion connector of the printed circuit card to the circuit board connector; and a single means far locking the connectors together, the means for locking including a slider, which sits in a hollow formed by the base, a locking tab, integrally connected to the slider, which fits into a slot formed between a main body of the circuit card and an extension therefrom, and a handle, integrally connected to the slider, by which the slider may be moved back and forth in the hollow axially along the base so as to engage and disengage the locking tab with the slot, the slider having an index ball, integrally connected to the slider, which indicates whether the means for locking is in a locking position by fitting into a locking slot cut into the base.

2. The apparatus according to claim 1, wherein the snaplet arrangement includes a pair of snaplets, the pair of snaplets to snap onto the board connector.

3. The apparatus according to claim 1, further comprising:

a short crosspiece, integrally connected to the base and having a surfaces defining a valley, which acts to guide a card arm into place during connection of the connectors.

4. The apparatus according to claim 1, wherein the means for locking secures the connectors together by fitting into a slot formed between a main body of the circuit card and an extension therefrom, the main body of the circuit card being integrally connected to one of the connectors.

5. The apparatus according to claim 1, wherein the locking tab has a diagonally angled edge which assists in engagement of the locking tab into the slot.

6. The apparatus according to claim 1, further comprising:

a stopper, integrally connected to the base, which prevents the means for locking from disengaging from the base.

7. The apparatus according to claim 1, the slider further comprising:

an end which prevents the means for locking from disengaging from the base by abutting a stopper integrally attached to the base.

8. The apparatus according to claim 1, further comprising:

a base extension extending from the base; and at least one bridge connecting across a set of long crosspieces of the base extension and forming a hollow in the base extension.

\* \* \* \* \*